(12) United States Patent
Mostafazadeh

(10) Patent No.: US 6,420,212 B1
(45) Date of Patent: Jul. 16, 2002

(54) METHOD AND APPARATUS TO ENCLOSE DICE

(75) Inventor: Shahram Mostafazadeh, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/611,245

(22) Filed: Jul. 7, 2000

(51) Int. Cl.⁷ .............................................. H01L 21/50
(52) U.S. Cl. ...................... 438/118; 438/112; 438/124; 438/127; 257/632; 257/783; 257/786; 257/790; 257/797
(58) Field of Search ................................ 438/613, 127, 438/108, 118, 124, 126, 112; 257/737, 738, 786, 790, 783, 797, 632

(56) References Cited

U.S. PATENT DOCUMENTS

| | | | | |
|---|---|---|---|---|
| 5,496,775 A | * | 3/1996 | Brooks ........................ | 438/613 |
| 6,023,094 A | * | 2/2000 | Kao et al. .................... | 257/632 |
| 6,075,290 A | * | 6/2000 | Schaefer et al. ............. | 257/737 |
| 6,133,634 A | * | 10/2000 | Joshi ........................... | 257/738 |
| 6,204,095 B1 | * | 3/2001 | Farnworth ................... | 438/127 |
| 6,245,595 B1 | * | 6/2001 | Nguyen et al. .............. | 438/108 |

* cited by examiner

Primary Examiner—Hoai Ho
Assistant Examiner—Long K. Tran
(74) Attorney, Agent, or Firm—Beyer Weaver & Thomas LLP

(57) ABSTRACT

An improved die cover is provided. The cover is formed from an enclosure with adhesive, which holds a die in the enclosure. The enclosure may be formed as part of a panel of enclosures. The panel of enclosures may be held together by ties. Conventional die attach machinery may be used to place adhesive and dice in the enclosures of the panel of enclosures. The dice may be tested as a panel, and then the enclosures may be singulated.

20 Claims, 4 Drawing Sheets

METHOD AND APPARATUS TO ENCLOSE DICE

FIELD OF THE INVENTION

The present invention relates generally to integrated circuits. More specifically, the invention relates to enclosing integrated circuits.

BACKGROUND OF THE INVENTION

U.S. patent application Ser. No. 09/006,759 entitled "A Semiconductor Wafer Having A Bottom Surface Protective Coating", by Kao et al., filed on Jan. 14, 1998 discloses providing a protective coating on a bottom surface of a semiconductor die. According to the application, a wafer for flip-chips or surface mount dice is coated on a back side with an epoxy and cured. One of the features of the protective coating is to provide protection from light induced bias. Such a protective coating does not cover the side of a die. Processing of surface mount dice may make it difficult to provide a protective coating that is opaque.

The micro surface mount die is an extension of flip chip technology where solder bumps on die pads are the means to make electrical connections between the die and a PC board. Thus the micro surface mount die (SMD) is a true chip size package where the die is the package.

Micro SMD wafers go through normal wafer fabrication processes except that the die pads are redistributed to create a standard pattern of the bumps. Bumps are then provided on the die pads. After the bumping process is completed, the back of the wafer may be coated with epoxy and cured. The wafer may then be singulated.

To facilitate discussion, FIG. 1 is a cross sectional view of a singulated micro surface mount die 10 with a bottom surface coating 12. Solder balls 14 have been mounted to the top side.

It would be desirable to provide protection from light induced bias to the sides of the semiconductor die. In addition, it would be desirable to provide protection from light induced bias, which is opaque to light.

SUMMARY OF THE INVENTION

To achieve the foregoing and other objects and in accordance with the purpose of the present invention, a variety of techniques is provided for providing protective coverings over a plurality of dice. Generally, dice are formed with an active top side and a bottom side opposite the top side. Enclosures are also formed. The dice are placed in the enclosures so that the bottom side of each die is adjacent to the bottom of an enclosure.

In another embodiment of the invention, a die, and an enclosure covering the bottom side and most of the side surface of the die with adhesive between the die and the enclosure is provided.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 1:
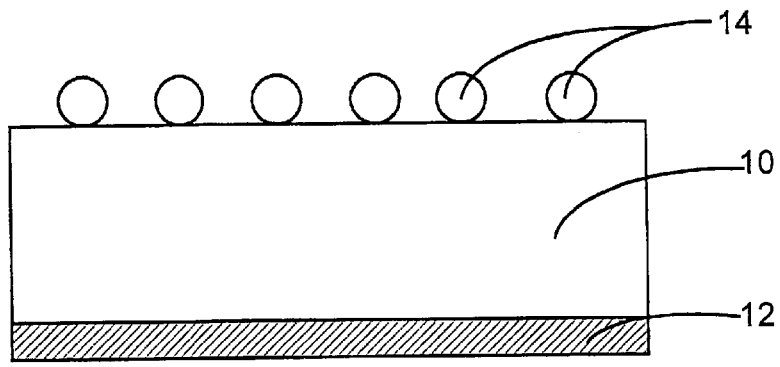
FIG. 1 is a cross sectional view of a singulated micro surface mount die used in the prior art.
Figure 2:
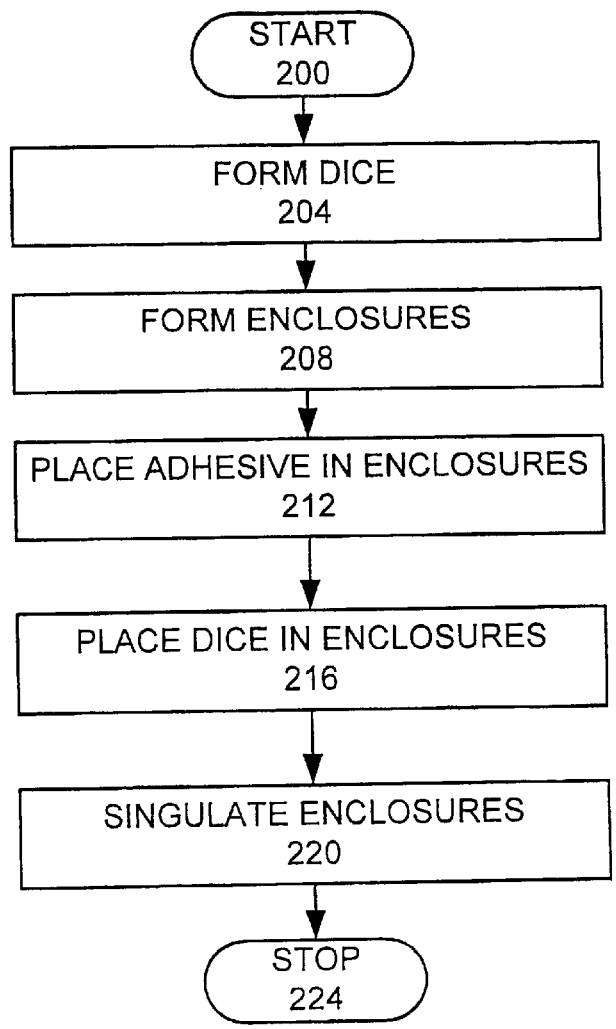
FIG. 2 is a flow chart of a method used in a preferred embodiment of the invention.
Figure 3:
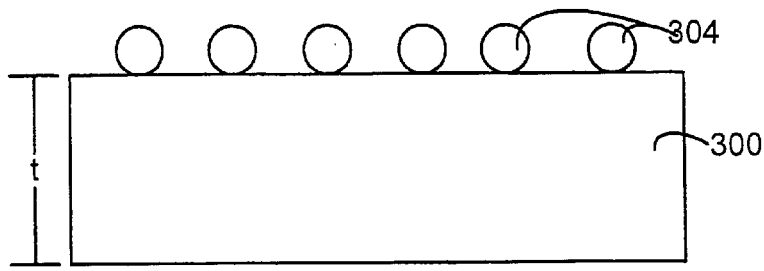
FIG. 3 is a cross-sectional a surface mount die used in the preferred embodiment of the invention.

To facilitate discussion, FIG. 2 is a flow chart of a method used in a preferred embodiment of the invention. According to the flow chart of FIG. 2, a plurality of dice is formed (step 204). FIG. 3 is a cross-sectional a surface mount die 300, that may be one of the plurality of dice that are formed. Conductive bumps 304, such as solder bumps, are attached to mounting pads on a top side of the surface mount die. Generally, for all dice used in the preferred embodiment of the invention, the dice have a single active side, which has pads such as connection pads for conductive bumps or bond pads for wire bonding. The top side is defined as the active side of the die and the bottom side is defined as the side opposite from the active side. The die 300 has a thickness "t" as shown.

Figure 4:
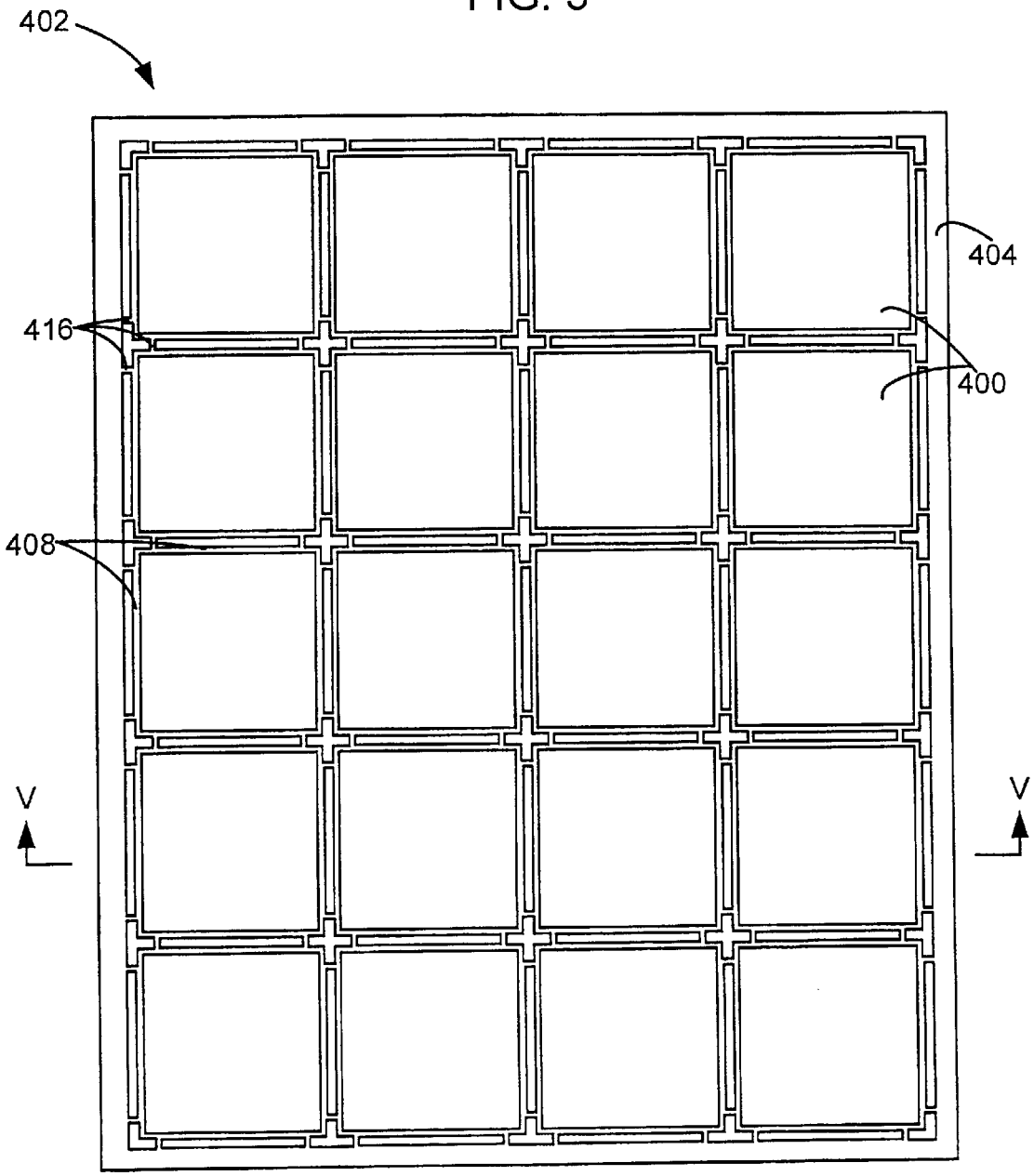
FIG. 4 is a top view of an enclosure panel.
Figure 5:
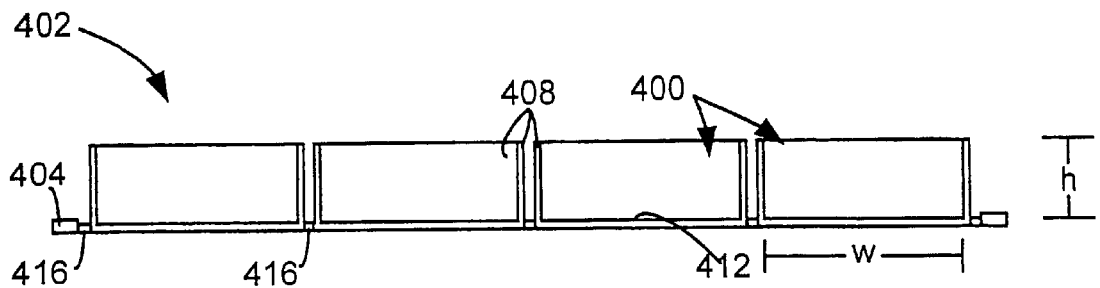
FIG. 5 is a cross-sectional view of the performed enclosures and enclosure frame of FIG. 4 along cut lines V—V.

A plurality of enclosures is formed (step 208). FIG. 4 is a top view of an enclosure panel 402, comprising plurality of performed enclosures 400 supported by an enclosure frame 404, which may be used in a preferred embodiment of the invention. FIG. 5 is a cross-sectional view of the performed enclosures and enclosure frame 404 of FIG. 4, along cut lines V—V. The enclosures 400 may comprise a plurality of walls 408 and a bottom 412. The enclosures 400 are supported by ties 416 between either enclosure walls 408 or bottoms 412 or the enclosure frame 404. The enclosure panel 402 may be formed from a plated metal, such as a copper sheet or Alloy 42, that is stamped or etched to form the enclosure frame 404, ties 416, and enclosures 400. Conventional lead frame manufacturing equipment may be used to form the enclosure panel 402. In the alternative, the enclosure panel may be made of molded plastic or ceramic. In an example of dimensions that may be used, the height h of the walls 408 may be between 10 to 30 mils. (Thousandths of an inch) (254 microns to 762 microns) and the width w of an enclosure 400 may be between 25 to 300 mils (635 microns to 7620 microns).

Figure 6:
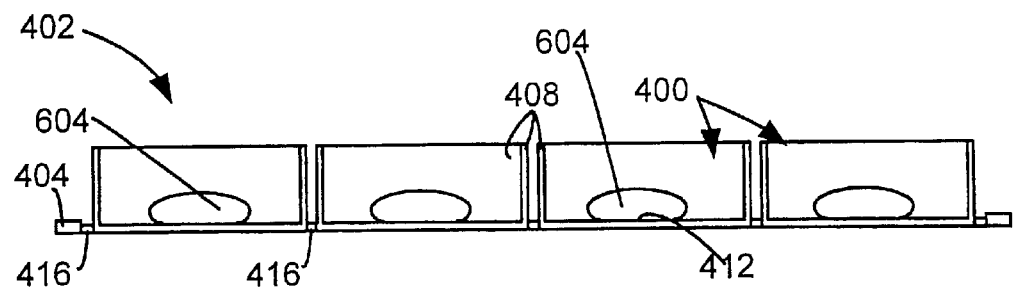
FIG. 6 is a cross-sectional view of the enclosure panel with adhesive placed in each enclosure.
Figure 7:
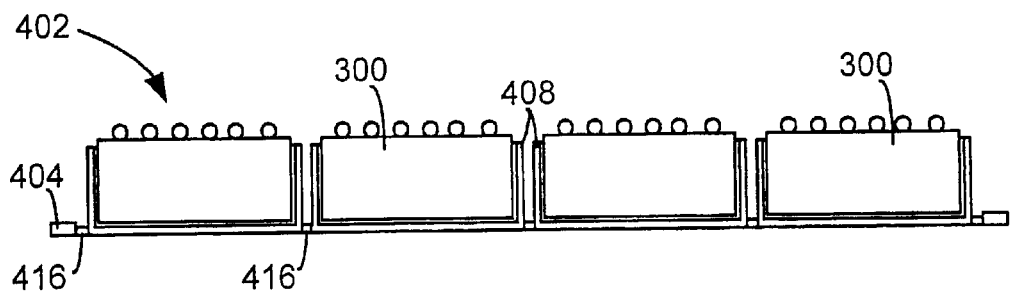
FIG. 7 is a cross-sectional view of the enclosure panel with a die placed in each enclosure.

The enclosure panel 402 may be placed in conventional die attach equipment. Conventional die attach equipment may be used to place and adhesive in each enclosure (step 212). FIG. 6 is a cross-sectional view of the enclosure panel 402 with adhesive 604 placed in each enclosure 400. The adhesive may be an epoxy or another conventional adhesive. Conventional die attach equipment may also be used to place a die in each enclosure (step 216). FIG. 7 is a cross-sectional view of the enclosure panel 402 with a die 300 placed in each enclosure 400. As can be seen in FIG. 7, in the preferred embodiment, the dice 300 are thicker than the depth of the enclosures 400 (the height h of the enclosure walls 408), so that the top side of the dice 300 are outside of the enclosures 400. The backside of the dice 300 are adjacent to the bottoms 412 of the enclosures 400. The adhesive may a snap type adhesive, which may be cured using a snap cure or an adhesive which is cured in an oven. The dice 300 may be tested before singulation. Testing the dice 300 before singulation may allow testing in panel form, which may be easier than testing after singulation.

The ties 416 of the enclosure panel 402 are then cut to singulate the enclosures 400 (step 220). Conventional equipment such as wafer saws or lasers may be used to cut the ties.

Figure 8:
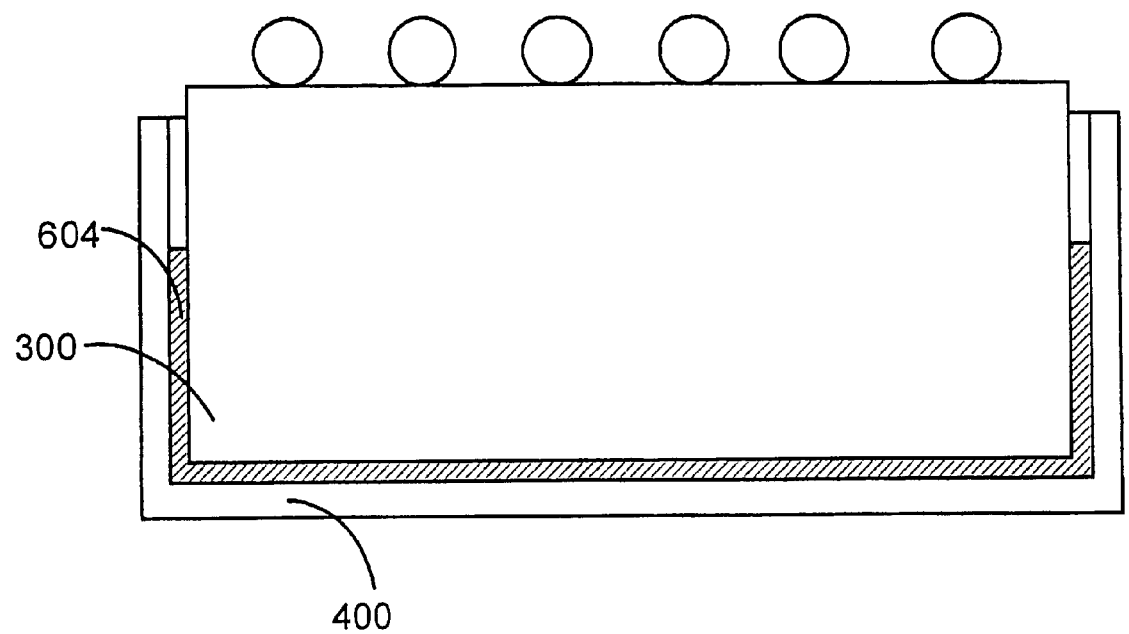
FIG. 8 is an enlarged cross-sectional view of a singulated enclosure containing a die attached to the enclosure by the adhesive.

FIG. 8 is an enlarged cross-sectional view of a singulated enclosure 400 containing a die 300 attached to the enclosure 400 by the adhesive 604. The enclosure 400 may provide a completely opaque cover for the bottom and most of the side of the die to protect the bottom and most of the side of the die from light induced bias. The enclosure 400 may also protect the edge around the bottom of the die from chipping.

In order for the enclosure 400 to protect most of the sides of the die 300 the height h of the walls of the enclosure 400 must be at least 50% of the thickness t of the die. Preferably the height h of the walls of the enclosure 400 is at least 80% of the thickness of the die.

Although the enclosure panel shown is four enclosures wide by five enclosures long, any number of enclosures may be in the enclosure panel. In addition, enclosure frame may have different shapes possibly extending between the enclosures. Such a frame may have different widths and may be used for handling the enclosure panel.

The walls of the enclosure do not extend to the top surface of the die to prevent the enclosure from interfering with the die, such as causing a short of the electrical connections.

The use of conventional equipment allows less expensive tooling and set up to perform the inventive process. The use of the enclosures also eliminates the need for coating the bottom side of a wafer. The use of a metal enclosure provides a heat sink and therefore improved thermal performance.

The die is preferably a flip chip to be mounted on a substrate, which may then be mounted on a PC or a surface mount die, which may be directly mounted on a PC board. The die may also be wire bonded to a substrate or PC board.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for providing protective coverings for a plurality of dice, comprising:

forming the plurality of dice wherein each die has an active top side and a bottom side opposite from the top side;

forming a plurality of enclosures wherein each enclosure has a bottom and at least one wall surrounding the bottom;

placing the plurality of dice in the plurality of enclosures, wherein each die is placed in an enclosure so that the bottom side of the die is adjacent to the bottom of the enclosure; and placing adhesive in each of the plurality of enclosures to attach each enclosure of the plurality of enclosures to a die of the plurality of dice.

2. The method, as recited in claim 1, wherein the topside of each die extends above the walls of the enclosures.

3. The method, as recited in claim 2, wherein the forming the plurality of enclosures forms the plurality of enclosures as part of an enclosure panel, and further comprising singulating the plurality of enclosures after the placing the plurality of dice in the plurality of enclosures.

4. The method, as recited in claim 3, further comprising testing the plurality of dice before the singulating the plurality of enclosures.

5. The method, as recited in claim 4, wherein the forming the plurality of enclosures comprises:

providing a metal sheet; and stamping the metal sheet.

6. The method, as recited in claim 5, further comprising placing a plurality of conductive bumps on the active top sides of the plurality of dice.

7. The method, as recited in claim 6, wherein the plurality of dice are surface mount dice.

8. The method, as recited in claim 3, wherein the enclosure panel, comprises:

at least one enclosure frame; and a plurality of ties between the plurality of enclosures and the at least one enclosure frame.

9. The method, as recited in claim 8, wherein the singulating the plurality of enclosures comprises the step of cutting the ties.

10. The method, as recited in claim 9, wherein the height of the enclosures are at least 50% of the thickness of the dice.

11. The method, as recited in claim 10, further comprising testing the plurality of dice after the dice have been placed in enclosures and before the singulating of the enclosures.

12. The method, as recited in claim 3, further comprising testing the plurality of dice after the dice have been placed in enclosures and before singulating the enclosures.

13. A method for providing protective coverings for a plurality of dice, comprising:

forming the plurality of dice wherein each die has an active top side and a bottom side opposite from the top side;

forming a plurality of enclosures wherein each enclosure has a bottom and at least one wall surrounding the bottom; and placing the plurality of dice in the plurality of enclosures, wherein each die is placed in an enclosure so that the bottom side of the die is adjacent to the bottom of the enclosure, and the top side of each die extends above the walls of the enclosures.

14. The method, as recited in claim 13, wherein the forming the plurality of enclosures forms the plurality of enclosures as part of an enclosure panel, and further comprising singulating the plurality of enclosures after the placing the plurality of dice in the plurality of enclosures.

15. The method, as recited in claim 14, further comprising testing the plurality of dice before the singulating the plurality of enclosures.

16. The method, as recited in claim 13, wherein the forming the plurality of enclosures comprises:

providing a metal sheet; and stamping the metal sheet.

17. A method for providing protective coverings for a plurality of dice, comprising:

forming the plurality of dice wherein each die has an active top side and a bottom side opposite from the top side;

forming a plurality of enclosures wherein each enclosure has a bottom and at least one wall surrounding the bottom;

placing the plurality of dice in the plurality of enclosures, wherein each die is placed in an enclosure so that the bottom side of the die is adjacent to the bottom of the enclosure, wherein the plurality of enclosures are part of an enclosure panel; and singulating the plurality of enclosures after the placing the plurality of dice in the plurality of enclosures.

18. The method, as recited in claim 17, further comprising testing the plurality of dice before the singulating the plurality of enclosures.

19. The method, as recited in claim 17, wherein the enclosure panel, comprises:

at least one enclosure frame; and a plurality of ties between the plurality of enclosures and the at least one enclosure frame.

20. The method, as recited in claim 19, wherein the singulating the plurality of enclosures comprises the step of cutting the ties.

* * * * *